(12) United States Patent
Iuchi

(10) Patent No.: US 9,560,430 B2
(45) Date of Patent: Jan. 31, 2017

(54) WATERPROOF STRUCTURE AND ELECTRONIC EQUIPMENT INCLUDING THE SAME

(71) Applicant: JVC KENWOOD CORPORATION, Yokohama-shi, Kanagawa (JP)

(72) Inventor: Junji Iuchi, Yokohama (JP)

(73) Assignee: JVC KENWOOD CORPORATION, Yokohamashi, Kanagawa (JP)

( * ) Notice: Subject to any disclaimer, the term of this patent is extended or adjusted under 35 U.S.C. 154(b) by 106 days.

(21) Appl. No.: 13/775,792

(22) Filed: Feb. 25, 2013

(65) Prior Publication Data

US 2013/0223656 A1    Aug. 29, 2013

(30) Foreign Application Priority Data

Feb. 28, 2012   (JP) .................................. 2012-041622
Feb. 28, 2012   (JP) .................................. 2012-041629
Feb. 28, 2012   (JP) .................................. 2012-041635

(51) Int. Cl.
*H04R 1/02*     (2006.01)
*H04R 1/08*     (2006.01)
(Continued)

(52) U.S. Cl.
CPC ................ *H04R 1/02* (2013.01); *H04R 1/023* (2013.01); *H04R 1/086* (2013.01); *B81B 7/0009* (2013.01);
(Continued)

(58) Field of Classification Search
CPC ............... H04R 1/00; H04R 1/02; H04R 1/08; H04R 1/086; H04R 1/021; H04R 1/342; H04R 1/2892; H04R 11/04; H04R 9/08; H04R 25/65; H04R 25/658; B81B 2201/0257; B81B 7/0029; B81B 7/0058
(Continued)

(56) References Cited

U.S. PATENT DOCUMENTS 4,920,564 A * 4/1990 Allkins ................... H04M 1/03
                                                           181/242
6,078,792 A * 6/2000 Phillips ................... H04M 1/18
                                                           455/575.1
(Continued)

FOREIGN PATENT DOCUMENTS

CN          1909742 A       2/2007
JP          07336262 A     12/1995
(Continued)

OTHER PUBLICATIONS

Japanese Office Action dated Apr. 7, 2015 corresponding to application No. 2012-041622.
(Continued)

*Primary Examiner* — Davetta W Goins
*Assistant Examiner* — Oyesola C Ojo
(74) *Attorney, Agent, or Firm* — Nath, Goldberg & Meyer; Jerald L. Meyer; Leonid D. Thenor

(57) ABSTRACT

A waterproof structure includes a housing, an electroacoustic transducer, a packing and an annular member. The electroacoustic transducer has a case formed with tone holes. The packing is interposed between the housing and the electroacoustic transducer and has a thin film part on a part opposed to the tone holes. The annular member is interposed between the thin film part and the case and surrounds the tone holes. A space surrounded by the thin film part, the annular member and the case is formed. The annular member is configured to bias the thin film part of the packing.

8 Claims, 8 Drawing Sheets

(51) Int. Cl.
*B81B 7/00* (2006.01)
*H04R 1/28* (2006.01)

(52) U.S. Cl.
CPC ............ *B81B 7/0029* (2013.01); *B81B 7/0058* (2013.01); *H04R 1/2803* (2013.01); *H04R 1/2811* (2013.01)

(58) Field of Classification Search
USPC .................................................. 381/189, 322
See application file for complete search history.

(56) References Cited

U.S. PATENT DOCUMENTS

| | | | | |
|---|---|---|---|---|
| 6,188,773 | B1* | 2/2001 | Murata | .................. H04R 1/005 |
| | | | | 128/201.19 |
| 7,346,179 | B1 | 3/2008 | Bobisuthi | |
| 2004/0029530 | A1* | 2/2004 | Noguchi | ................ H04R 5/023 |
| | | | | 455/23 |
| 2010/0247857 | A1* | 9/2010 | Sanami | ................... H04M 1/18 |
| | | | | 428/138 |

FOREIGN PATENT DOCUMENTS

| | | | | |
|---|---|---|---|---|
| JP | 2005184422 | * | 7/2005 | ............... H04R 9/08 |
| JP | 2006-333076 | * | 12/2006 | ............... H04R 1/02 |
| JP | 2006-333076 A | | 12/2006 | |
| JP | 2006333076 | * | 12/2006 | ............... H04R 1/00 |
| JP | 2008182391 A | | 8/2008 | |
| JP | 2009152926 A | * | 7/2009 | ............... H04B 1/38 |
| WO | 2011/080877 A1 | | 7/2011 | |

OTHER PUBLICATIONS

Chinese Office Action dated Jul. 31, 2015 in corresponding Chinese Application No. 201310061052.5.
European Search Report dated Sep. 16, 2016 issued in corresponding European Application No. 13 00 0958.

* cited by examiner

WATERPROOF STRUCTURE AND ELECTRONIC EQUIPMENT INCLUDING THE SAME

CROSS REFERENCE TO RELATED APPLICATION

This application claims benefit of priority under 35 U.S.C. §119 to Japanese Patent Applications No. 2012-041622 filed on Feb. 28, 2012, No. 2012-041629 filed on Feb. 28, 2012, and No. 2012-041635 filed on Feb. 28, 2012, the entire contents of which are incorporated by reference herein.

BACKGROUND

The present invention relates to a waterproof structure and electronic equipment including the waterproof structure.

As one example of a waterproof structure used when an electroacoustic transducer (for example, a microphone, a speaker or the like) is to be attached to a case panel, there is known a structure as described in Japanese Patent Application Laid-Open Publication No. 2006-333076 (Patent Literature 1). This structure is configured such that a microphone is pressed and fitted into a sleeve of the case panel in a state where the microphone is embraced by a substantially cylindrical rubber shield member. Waterproofness and favorable acoustic characteristics are obtained by disposing a thin film on a part of the shield member facing a tone port formation area of the microphone and forming a space between the thin film part and the microphone.

In the waterproof structure described in Patent Literature 1, since the body of the shield member is made of rubber and hence is soft, it is liable to be deformed when pressed into the sleeve. In addition, the thin film part of the shield member is not in contact with other members. Thus, the thin film part is readily deformed together with the body of the shield member when the shield member is pressed into the sleeve of the case panel. If the thin film part is deformed, the vibration characteristic of the thin film part may be changed and it may sometimes occur that sound gathered by the microphone fails to maintain the designed quality and is deteriorated. In addition, (1) presence of deformation of the thin film part with deformation of the body of the shield member and (2) the deformation condition observed when the thin film part is deformed, differ among individual microphones. Thus, the quality of the sound gathered by the microphone also differs among the microphones and a large fluctuation occurs in the sound quality.

The quality of the sound gathered by the microphone to which the waterproof structure described in Patent Literature 1 is applied is liable to be deteriorated and to fluctuate as mentioned above and further improvement is desirable. When an object to which the above-mentioned waterproof structure is applied is a speaker, deterioration and fluctuation of the sound quality occur similarly. That is, the quality of sound reproduced by the speaker is liable to be deteriorated and to fluctuate and hence further improvement is also desirable.

SUMMARY

The present invention aims to provide a waterproof structure that favorably suppresses deterioration and fluctuation of the quality of sound reproduced or gathered by an electroacoustic transducer when the waterproof structure has been applied to the electroacoustic transducer, and electronic equipment including the waterproof structure.

According to an embodiment of the present invention, there is provided a waterproof structure comprising: a housing; an electroacoustic transducer that includes a case formed with tone holes; a packing that is interposed between the housing and the electroacoustic transducer and includes a thin film part on a part opposed to the tone holes; and an annular member that is interposed between the thin film part and the case and surrounds the tone holes, wherein a space surrounded by the thin film part, the annular member and the case is formed, and the annular member is configured to bias the thin film part of the packing.

According to the embodiment of the present invention, it is possible to favorably suppress deterioration and fluctuation of the quality of the reproduced sound or the gathered sound.

DETAILED DESCRIPTION

Waterproof structures according to a first and a second embodiment of the present invention will be described with reference to FIG. 1 to FIG. 11D. The waterproof structures according to the first and second embodiments are waterproof structures BK and BK2 applied to an electric signal converter that converts electrical signals to sounds or converts sounds to electrical signals. A microphone M is adopted as an electroacoustic transducer.

First Embodiment

Figure 1:
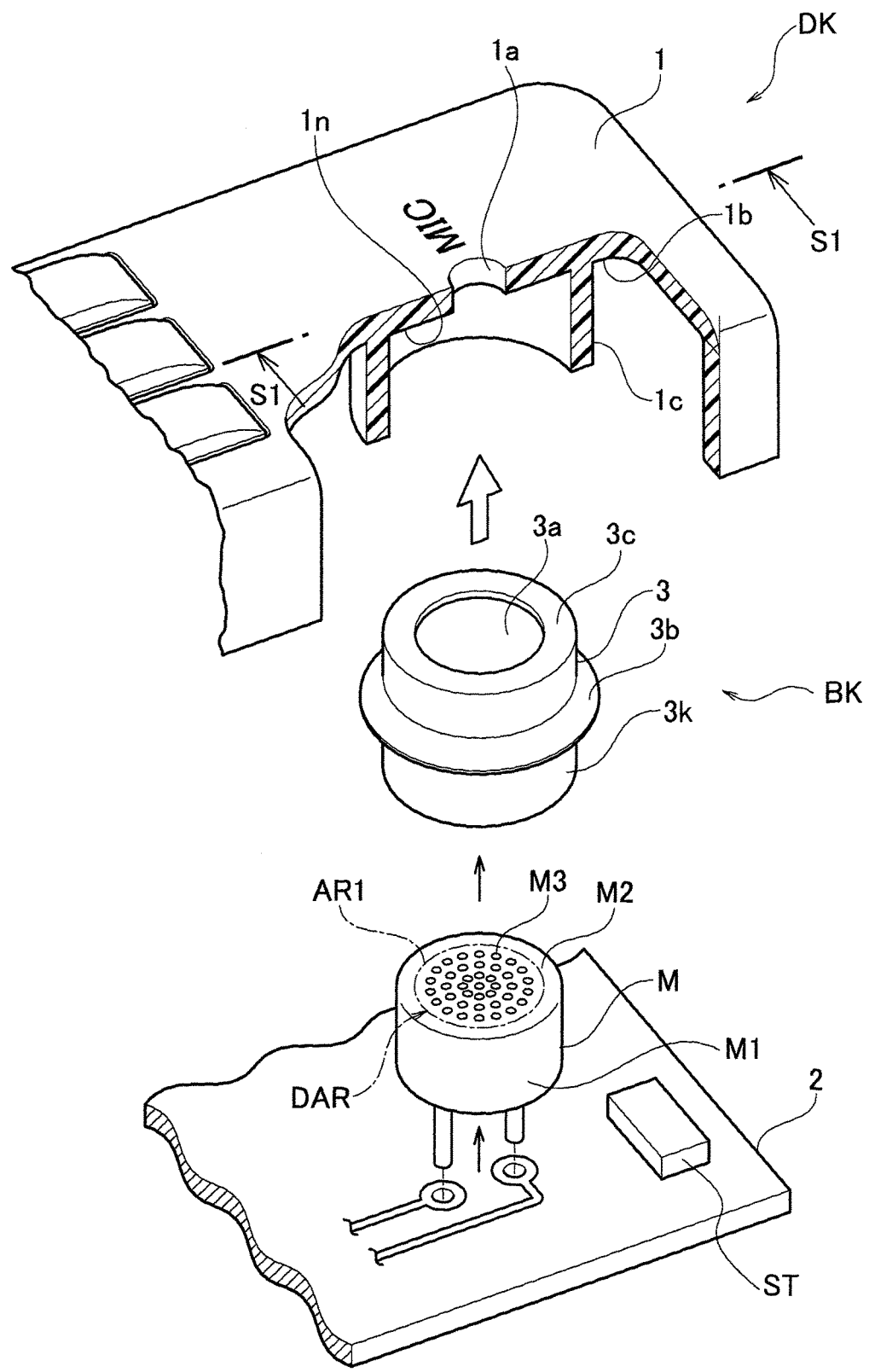
FIG. 1 is a partial exploded diagram illustrating a waterproof structure according to a first embodiment of the present invention.
Figure 2:
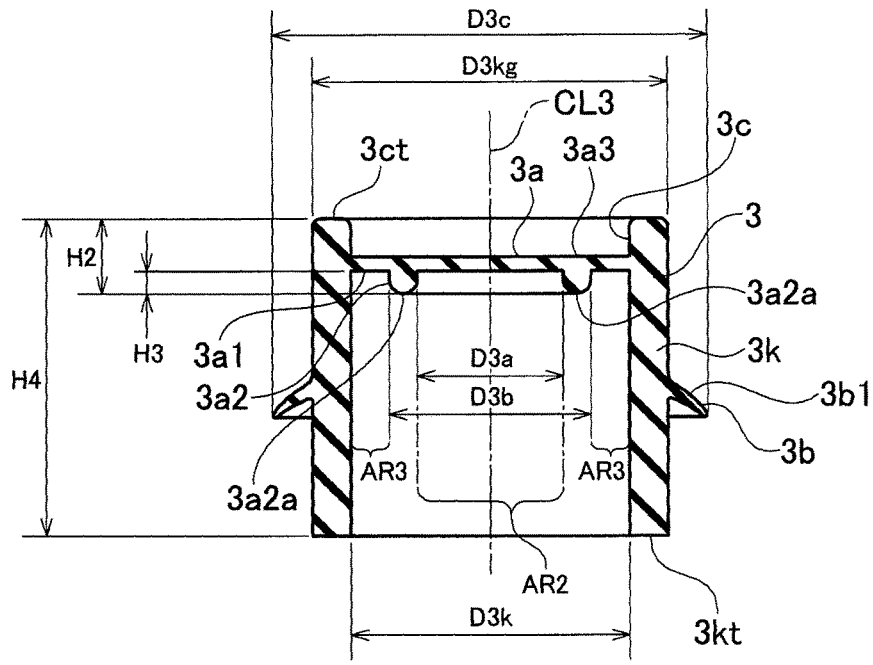
FIG. 2 is a cross-sectional diagram illustrating a packing in the waterproof structure according to the first embodiment of the present invention.
Figure 3:
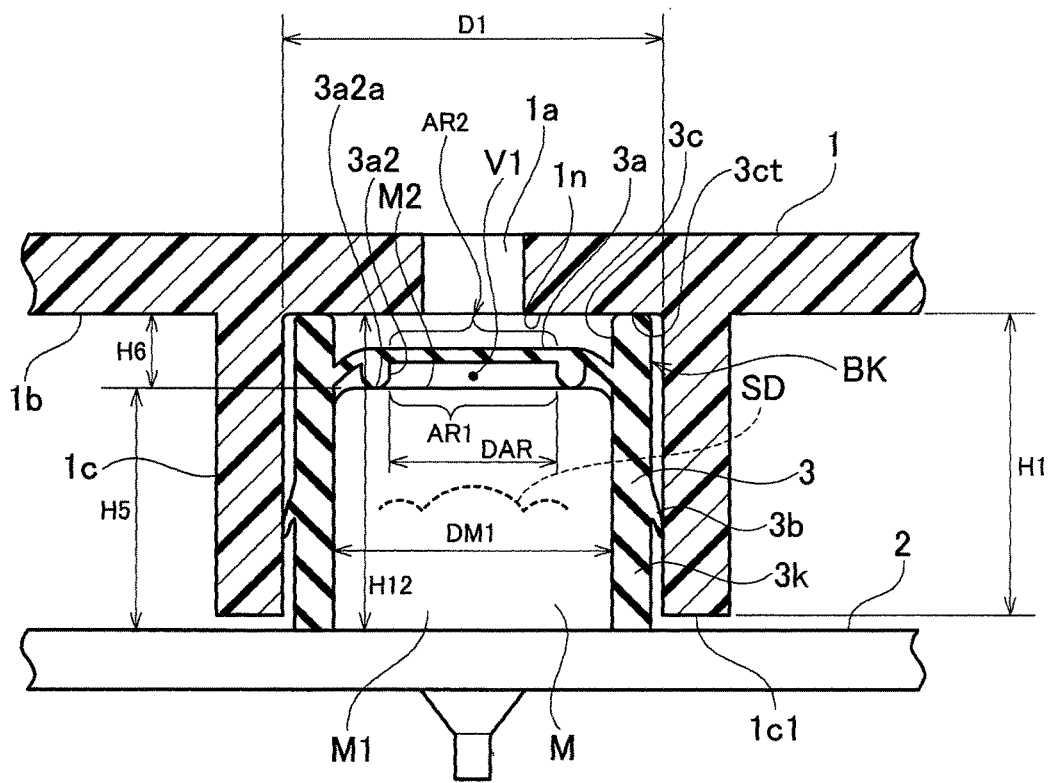
FIG. 3 is a partial cross-sectional diagram illustrating the waterproof structure according to the first embodiment of the present invention.
Figure 4:
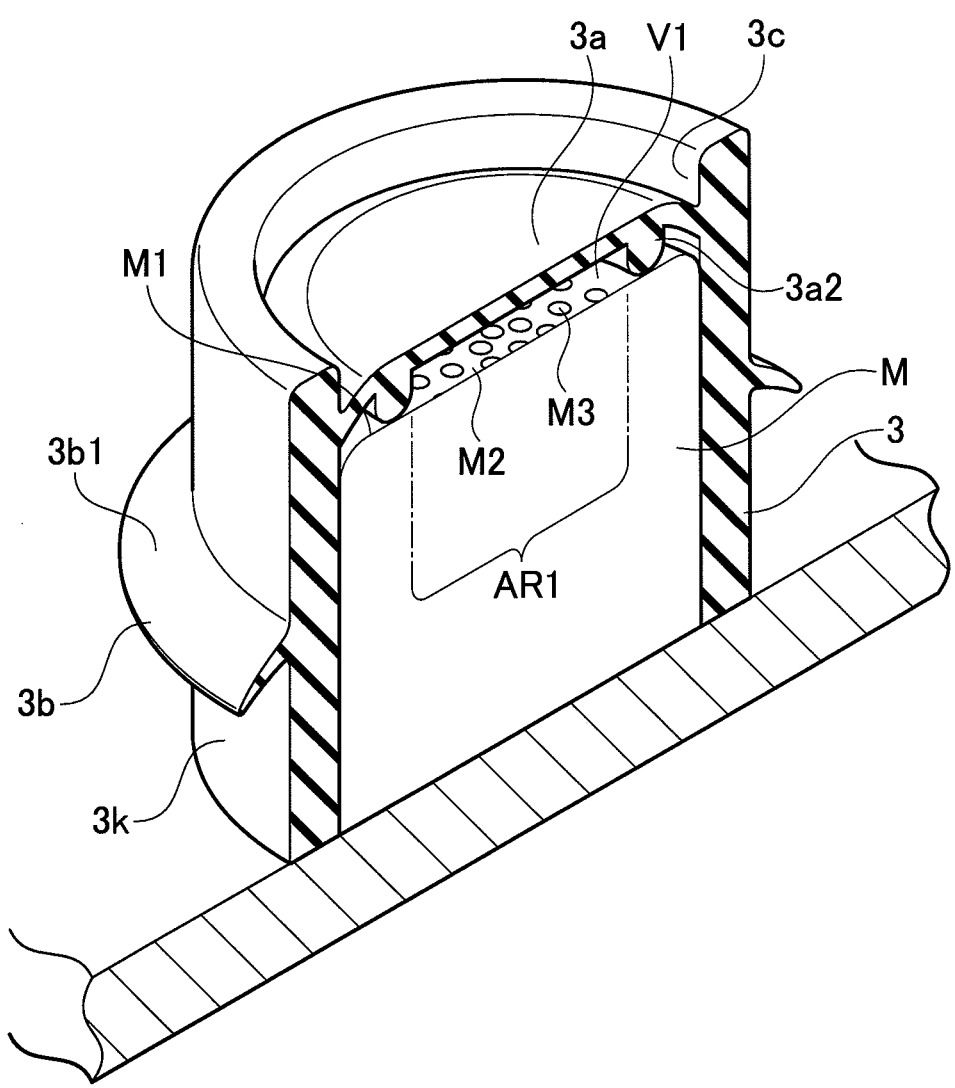
FIG. 4 is a perspective cross-sectional diagram illustrating the waterproof structure according to the first embodiment of the present invention.

A configuration or the like of the waterproof structure according to a first embodiment will be described with reference to FIG. 1 to FIG. 4. FIG. 1 is a partial exploded diagram illustrating the waterproof structure BK in the vicinity of the microphone M in electronic equipment (for example, a transceiver) DK mounting the microphone M. FIG. 2 is a cross-sectional diagram illustrating a packing 3 used in the waterproof structure BK. FIG. 3 is a cross-sectional diagram taken along an S1-S1 line in FIG. 1, illustrating a state of the waterproof structure BK after assembled. FIG. 4 is a perspective cross-sectional diagram illustrating a state that the packing 3 has been put on the microphone M down to a predetermined position.

The electronic equipment DK includes, within a housing 1, a circuit substrate 2, the microphone M which is the electroacoustic transducer mounted on the circuit substrate 2, and the packing 3 interposed between the microphone M and the housing 1 that has been put on the microphone M. The circuit substrate 2 includes a signal transmitter ST that processes an electric signal output from the microphone M and transmits the signal to the outside in a wireless or wired manner. The microphone M includes a case M1 which is formed into a cylindrical shape by a thin metal material, and a diaphragm SD (see FIG. 3) contained in the case M1. A plurality of air holes M3 is formed in a leading end face M2 of the case M1 as tone holes for transmitting to the diaphragm SD, aerial vibration from the outside. An area of the leading end face M2 where the plurality of air holes M3 is formed is referred to as an opening area AR1.

The housing 1 includes a sound gathering hole 1a which is a through-hole formed at a position that is opposed to the opening area AR1 of the microphone M in a state after assembled, and a cylindrical wall-shaped sleeve 1c which is formed upright on an inner surface 1b, surrounding the sound gathering hole 1a which is the through-hole. The housing 1 is formed, for example, by injection-molding a resin. A height H1 of the sleeve 1c is set such that a leading end face 1c1 of the sleeve 1c is brought into contact with or adjacent to a surface of the circuit substrate 2 in the state after assembled. An inner diameter D1 of the sleeve 1c is set in relation to, for example, an outer diameter D3c (see FIG. 2) of the packing 3.

The packing 3 is formed into a bottomed cylindrical shape. Specifically, the packing 3 includes a cylindrical base 3k having one end (a lower side end in FIG. 2) which is opened, a thin film part 3a disposed on other end side of the base 3k, and a peripheral rib 3b that protrudes from an outer peripheral surface of the base 3k outward in a radial direction continuously fully around the base 3k. Moreover, the packing 3 is made of a flexible and restorable elastic material. Rubber is an example of the elastic material and is preferably silicone rubber. The thin film part 3a is formed to be thin enough to transmit (pass) aerial vibration from one surface side thereof to air on the other surface side thereof so as to be used for the electroacoustic transducer smoothly. For example, when the thin film part 3a is made of silicone rubber, it is desirable that a thickness thereof be not more than 0.2 mm. In particular, in case of the microphone, it is more desirable that the thickness be not more than 0.15 mm because it is desirable to increase the sensitivity at a low volume of sound (a small vibration). The thickness of the base 3k is, for example, 1.0 mm, that is, the base 3k is set thicker than the thin film part 3a.

The thin film part 3a is formed to extend along a face orthogonal to a central axis CL3 of the base 3k. The thin film part 3a is set thinner than the base 3k. A convex part 3a2 that protrudes downward in FIG. 2 in the ring-shaped form is formed on an inner surface 3a1 which is an inner surface of the thin film part 3a. Although the convex part 3a2 will be described as a part having an arc-shaped cross-section in the present embodiment, the shape of its cross-section is not limited to the arc. The convex part 3a2 exhibits a circular shape centering on the central axis CL3. The outer diameter D3b and an inner diameter D3a of the convex part 3a2 are set respectively in relation to an outer diameter DM1 of the microphone M and a minimum diameter DAR of the microphone M which is defined by including the opening area AR1 centering on the central axis CL3. A part of the thin film part 3a where the convex part 3a2 is formed is thicker than other parts of the thin film part 3a and hence is higher than other parts in rigidity. In addition, the thin film part 3a is divided into a disk-shaped area AR2 situated on the inner side of the convex part 3a2 and a ring-shaped area AR3 situated on the outer side of the convex part 3a2, owing to formation of the convex part 3a2. The base 3k includes an abutment part 3c that annularly protrudes upward in FIG. 2 relative to an outer surface 3a3 of the thin film part 3a. As illustrated in FIG. 2, the peripheral rib 3b is formed to include an inclined plane 3b1 which becomes thinner as it goes from its base toward its leading end and is inclined to be apart from the central axis CL3 as it goes downward in FIG. 2.

Incidentally, in the present embodiment, dimensions of respective members are defined as follows. A protruded height of the convex part 3a2 is defined as H3, a distance from an upper leading end of the base 3k in FIG. 2 to a leading end of the convex part 3a2 is defined as H2, and a length of the base 3k in the direction of the central axis CL3 is defined as H4. In addition, a height of the leading end face M2 of the microphone M measured from the surface of the circuit substrate 2 is defined as H5 and a distance from the leading end face M2 to the inner surface 1b of the housing 1 is defined as H6.

Next, a method of assembling the above-mentioned respective members and a state thereof after assembled will be described in detail. A worker covers the microphone M which is mounted on the circuit substrate 2 with the packing 3. That is, the microphone M is fitted into the base 3k of the packing 3. The base 3k of the packing 3 is formed such that an inner diameter D3k of the base 3k is the same as or slightly smaller than the outer diameter DM1 of the case M1 of the microphone M. Therefore, in the case that the packing 3 is made of rubber, when this fitting is performed, resistance is imparted in insertion and hence the microphone M is substantially press-fitted into the base 3k. In addition, when the packing 3 is fitted on the microphone M down to a position where an end face 3kt on its free end side approaches the circuit substrate 2 to some extent, the leading end face M2 of the case M1 comes into abutment on a leading end face 3a2a of the convex part 3a2 of the packing 3. Then, when the packing 3 is further pushed down so as to fit on the microphone M more deeply, the leading end face M2 biases the convex part 3a2 upward to push up the area AR2 of the thin film part 3a. This state is illustrated in FIG. 3 and FIG. 4. A flat and substantially cylindrical space V1 is formed among the area AR2 of the thin film part 3a, an inner peripheral surface of the convex part 3a2 and the leading end face M2 of the case M1 by this pushing-up.

The worker inserts the microphone M covered with the packing 3 into the sleeve 1c of the housing 1. Here, since the inner diameter D1 of the sleeve 1c is set larger than an outer diameter D3kg of the base 3k of the packing 3 and smaller than the outer diameter D3c of the peripheral rib 3b in its natural state, the peripheral rib 3b closely slides in such a deformed state that its outer diameter D3c is reduced relative to the inner surface of the sleeve 1c. A distance H12 between the circuit substrate 2 and an inner surface 1n of the housing 1 which is an inner bottom of the sleeve 1c in the assembled state is set such that a leading end face 3ct of the abutment part 3c of the packing 3 abuts on the inner surface 1n and comes into close contact with the inner surface 1n. In the above-mentioned case, the heights are in a relation of H12≤H4.

Although it is not unavoidable to set the respective dimensions such that this abutment is typically attained, the respective dimensions are set such that the convex part 3a2 is typically biased by the leading end face M2 of the microphone M to push up the area AR2 even when the leading end face 3ct of the abutment part 3c of the packing 3 is isolated from the inner surface 1n. Specifically, the heights are in a relation of H6<H2.

In the waterproof structure BK obtained by assembling the respective elements in the above-mentioned manner, even when rain drops or shower water drops enter the inside through the sound gathering hole 1a, water is hindered by the thin film part 3a of the packing 3 which is interposed between the sound gathering hole 1a and the case M1 of the microphone M and hence the water does not enter the inside of the microphone M. In addition, even if the water flows around to the outside of the packing 3 and then flows inwards, the water will not enter the circuit substrate 2 because at least the peripheral rib 3b is in close contact with the inner surface of the sleeve 1c continuously fully over its circumference. In addition, sound from the outside reaches the diaphragm SD within the case M1 from the air hole M3 through the area AR2 of the thin film part 3a and the space V1 formed between the area AR2 and the leading end face M2 of the case M1, and vibrates the diaphragm SD. Here, since the convex part 3a2 that surrounds the area AR2 of the thin film part 3a is pushed up by the microphone M, a part of the area AR2 of the thin film part 3a is stably maintained in a state that constant tension is generated. Thus, influence of deformation of other parts such as the base 3k, the area AR3 and others and internal stress generated by the deformation, are not exerted on the part of the area AR2. Therefore, the sound gathered by the microphone M is not deteriorated and no fluctuation occurs in the quality of the gathered sound.

In addition, the part of the area AR2 is surrounded by the highly rigid convex part 3a2, so that even if other parts such as the base 3k, the area AR3 and others are deformed when the packing 3 is fitted on the microphone M, influence of the deformation is more surely eliminated to maintain its shape. Further, since stress generated due to distortion generated by deformation of the base 3k is absorbed by deformation of the area AR3 situated on the outer side of the convex part 3a2 and the highly rigid convex part 3a2 surrounds the area AR2, propagation of the stress to the area AR2 situated on the inner side of the convex part 3a2 is more surely obstructed.

Therefore, the vibration characteristic of the thin film part 3a is maintained with no change, even if a fluctuation occurs in mounting condition when assembling the packing 3 onto the microphone M and/or the base 3k is deformed by assembling and the internal stress is generated with the deformation. Thus, when the waterproof structure according to the present embodiment is applied, the sound gathered by the microphone M is not deteriorated and hence no fluctuation occurs in the quality of the gathered sound.

Second Embodiment

Although the packing 3 is configured as a member that covers only the microphone M in the first embodiment, a packing 13A which is interposed between the housing 1 of the electronic equipment DK and other components including the microphone M contained in the housing 1 to exhibit a waterproofing function may be installed in place of the packing 3. A configuration and the like of a waterproof structure in which the packing 13A is installed in place of the packing 3 according to a second embodiment will be described with reference to FIG. 5.

Figure 5:
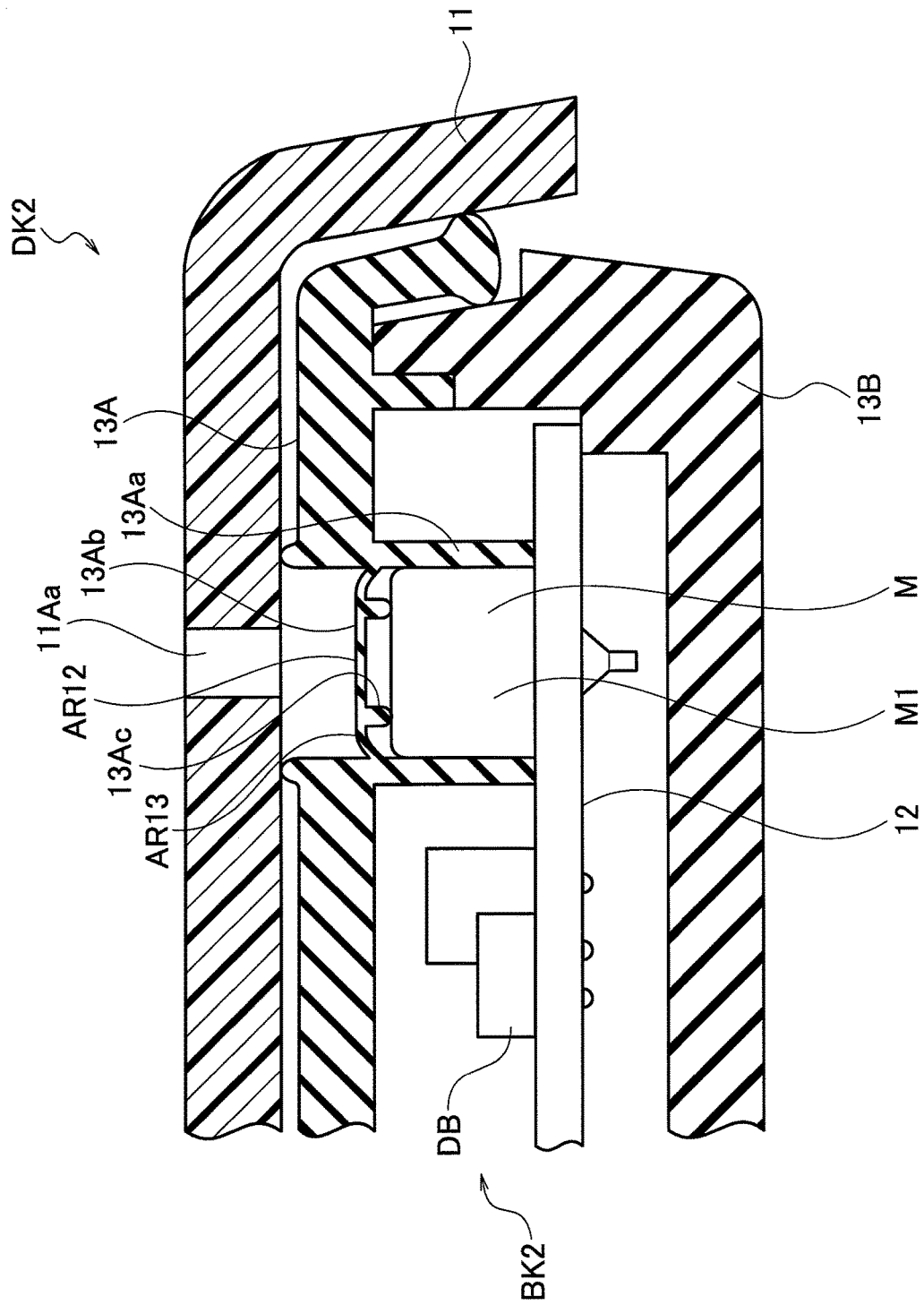
FIG. 5 is a partial cross-sectional diagram illustrating a waterproof structure according to a second embodiment of the present invention.

FIG. 5 is a partial cross-sectional diagram illustrating a region in the vicinity of the microphone M in electronic equipment DK2 that includes the microphone M and the waterproof structure BK2. The electronic equipment DK2 includes an upper housing 11 made of, for example, a resin material and a lower housing 13B formed by, for example, metal die casting as illustrated in FIG. 5. The lower housing 13B supports a circuit substrate 12 on which the microphone M and an electronic component DB are mounted and contains the circuit substrate 12 while preventing the circuit substrate 12 from being wetted by interposing the packing 13A that covers the circuit substrate 12 between the upper housing 11 and the lower housing 13B. The packing 13A is made of a flexible and restorable elastic material, such as silicon rubber, and the interior which is surrounded by the packing 13A and the lower housing 13B in a state that the upper housing 11 is combined with the lower housing 13B is in a sealed state that no water enters it from the outside.

A sleeve 13Aa is formed on a part of the packing 13A opposed to the microphone M as a bottomed cylindrical base to be fitted on the outer peripheral surface of the case M1 of the microphone M. A part corresponding to a bottom that closes one end of the sleeve 13Aa is configured as a film-shaped thin film part 13Ab which is thinner than other parts. The thin film part 13Ab corresponds to the thin film part 3a in the first embodiment and the shape of the thin film part 3a may be applied. That is, a convex part 13Ac that annularly protrudes toward the circuit substrate 12 is formed on the thin film part 13Ab and the convex part 13Ac is biased from the side of the circuit substrate 12 toward the upper housing 11 by the microphone M in an assembled state. With the aid of this bias, an inner disk-shaped area AR12 which is surrounded by the convex part 13Ac of the thin film part 13Ab is pushed upward toward the upper housing 11. In the upper housing 11, a sound gathering hole 11Aa that guides the sound from the outside to the thin film part 13Ab is formed in a part opposed to the area AR12.

As described above, according to the waterproof structure BK2, since the convex part 13Ac that surrounds the area AR12 of the thin film part 13Ab is pushed up by the microphone M, a part of the area AR12 of the thin film part 13Ab is stably maintained in a state that constant tension is generated. Thus, the area AR12 is not influenced by deformation of other parts such as the sleeve 13Aa and others of the packing 13A and internal stress generated by the deformation. Therefore, sound gathered by the microphone M is not deteriorated and no fluctuation occurs in the quality of the gathered sound.

In addition, the part of the area AR12 is surrounded by the highly rigid convex part 13Ac. Therefore, even if parts other than the area AR12 are deformed when the sleeve 13Aa of the packing 13A is fitted on the microphone M, influence of the deformation is more surely eliminated to maintain its shape. Further, since stress generated due to distortion generated by deformation of the sleeve 13Aa is absorbed by deformation of a ring-shaped area AR13 situated on the outer side of the convex part 13Ac of the thin film part 13Ab and the highly rigid convex part 13Ac surrounds the area AR12, propagation of the stress to the area AR12 situated on the inner side of the convex part 13Ac is more surely obstructed.

Therefore, the vibration characteristic of the thin film part 13Ab is maintained with no change, even if a fluctuation occurs in mounting condition when assembling the sleeve 13Aa of the packing 13A onto the microphone M and/or the base 3k is deformed by assembling and internal stress is generated with the deformation. Thus, when the waterproof structure according to the second embodiment is applied, the sound gathered by the microphone M is not deteriorated and hence no fluctuation occurs in the quality of the gathered sound.

It is sufficient to interpose a highly rigid ring-shaped member (an annular member) between the thin film part 3a and the microphone M in order to bias the thin film part 3a. Alternatively, the annular member may be integrated with the thin film part 3a and the annular member may be protruded from the thin film part 3a so as to configure it as a convex part. It is also possible to bias the thin film part 3a when the annular member is integrated with the case of the microphone M and the annular member is protruded from around tone holes of the microphone M so as to configure it as the convex part.

Modified Examples

Although examples that the convex parts 3a2 and 13Ac are respectively formed on the sides of the thin film parts 3a and 13Ab have been described in the first and second embodiments, the convex part may be disposed on the leading end face M2 side of the case M1 of the microphone M as a first modified example of the waterproof structures according to the first and second embodiments. In the above-mentioned case, as a second modified example of the waterproof structures according to the first and second embodiments, highly rigid parts may be respectively disposed on the thin film parts 3a and 13Ab between the areas AR2 and AR3 and between the areas AR12 and AR13. The first and second modified examples will be described with reference to FIG. 6 to FIG. 8. Although, in the following, the first and seconds modified examples will be described on the basis of the waterproof structure BK according to the first embodiment, the first and second modified examples are also applicable to the waterproof structure BK2 according to the second embodiment similarly.

Figure 6:
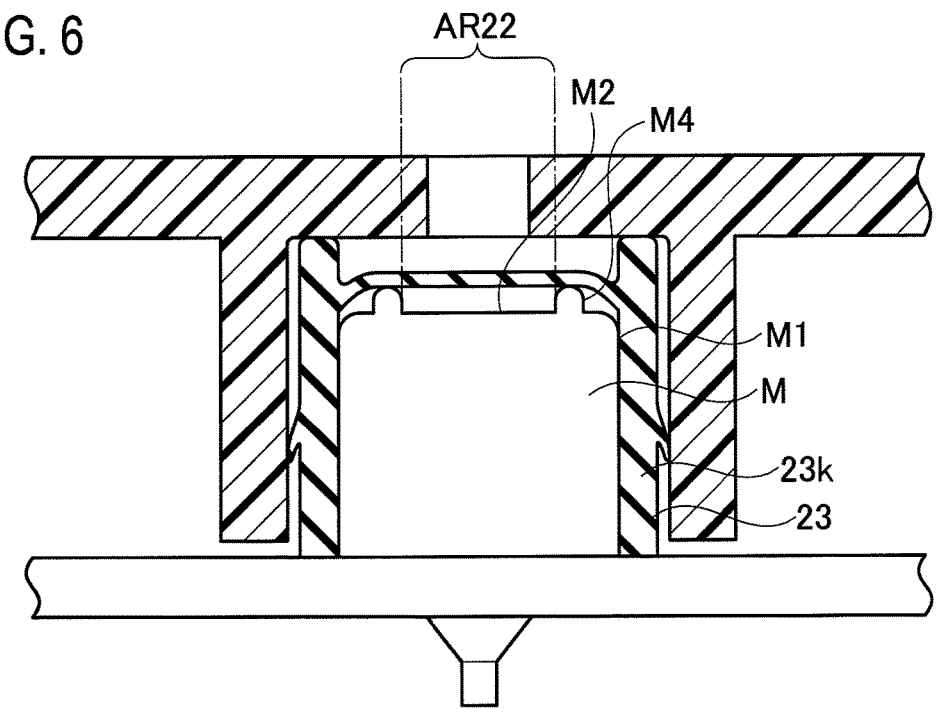
FIG. 6 is an essential part cross-sectional diagram illustrating a first modified example of the waterproof structure according to the first embodiment of the present invention.
Figure 7:
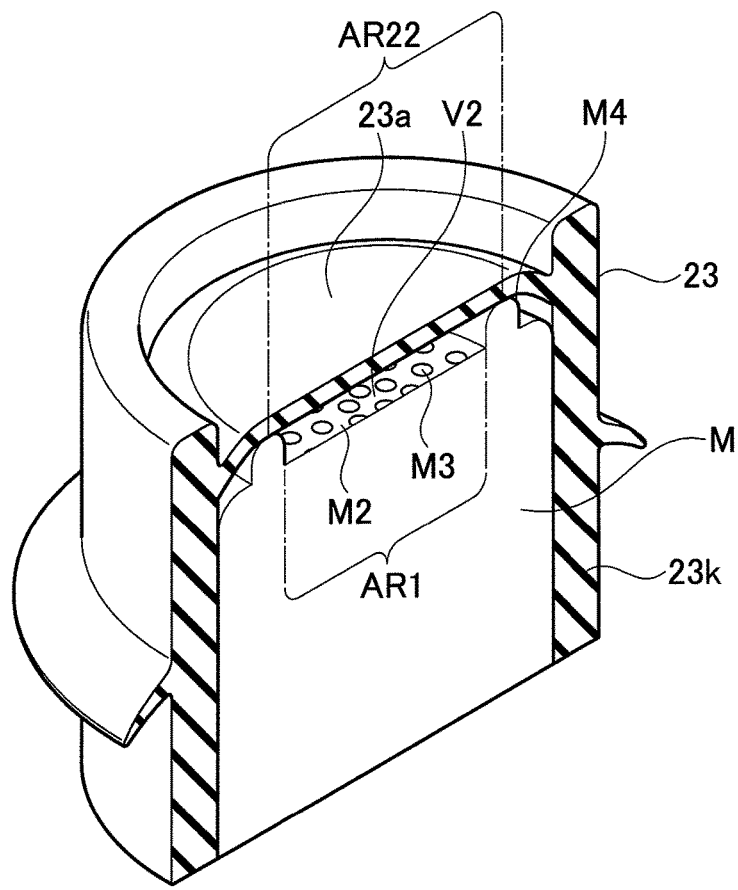
FIG. 7 is a perspective cross-sectional diagram illustrating the first modified example of the waterproof structure according to the first embodiment of the present invention.

FIG. 6 is a diagram corresponding to FIG. 3 and FIG. 7 is a diagram corresponding to FIG. 4. As illustrated in FIG. 6 and FIG. 7, a convex part that corresponds to the convex part 3a2 disposed on the thin film part 3a of the packing 3 in the first embodiment is not formed on a thin film part 23a of a packing 23 according to the first modified example, and a convex part M4 that protrudes in the ring-shaped form with the height H3 is disposed on the leading end face M2 of the case M1 of the microphone M, instead. Thus, an area AR22 of the thin film part 23a which is surrounded by the convex part M4 is pushed up in an assembled state. With the aid of this pushing-up, a flat and substantially cylindrical space V2 is formed among the area AR22 of the thin film part 23a, an inner peripheral surface of the convex part M4 and a part of the leading end face M2 of the case M1 which is surrounded by the convex part M4. Although the cross-sectional shape of the outline of the convex part M4 is illustrated as an arc in FIG. 6, the cross-sectional shape is not limited to the arc. In addition, the convex part M4 is formed so as to surround the opening area AR1 where the air holes M3 are formed.

According to the first modified example, the area AR22 of the thin film part 23a is pushed up by the convex part M4 situated at a position where the area AR22 is surrounded, the part of the area AR22 is stably maintained in a state that constant tension is generated. Thus, the area AR22 is not influenced by deformation of other parts such as the base 23k and others and internal stress generated due to the deformation. Therefore, the sound gathered by the microphone M is not deteriorated and no fluctuation occurs in the quality of the gathered sound.

Figure 8:
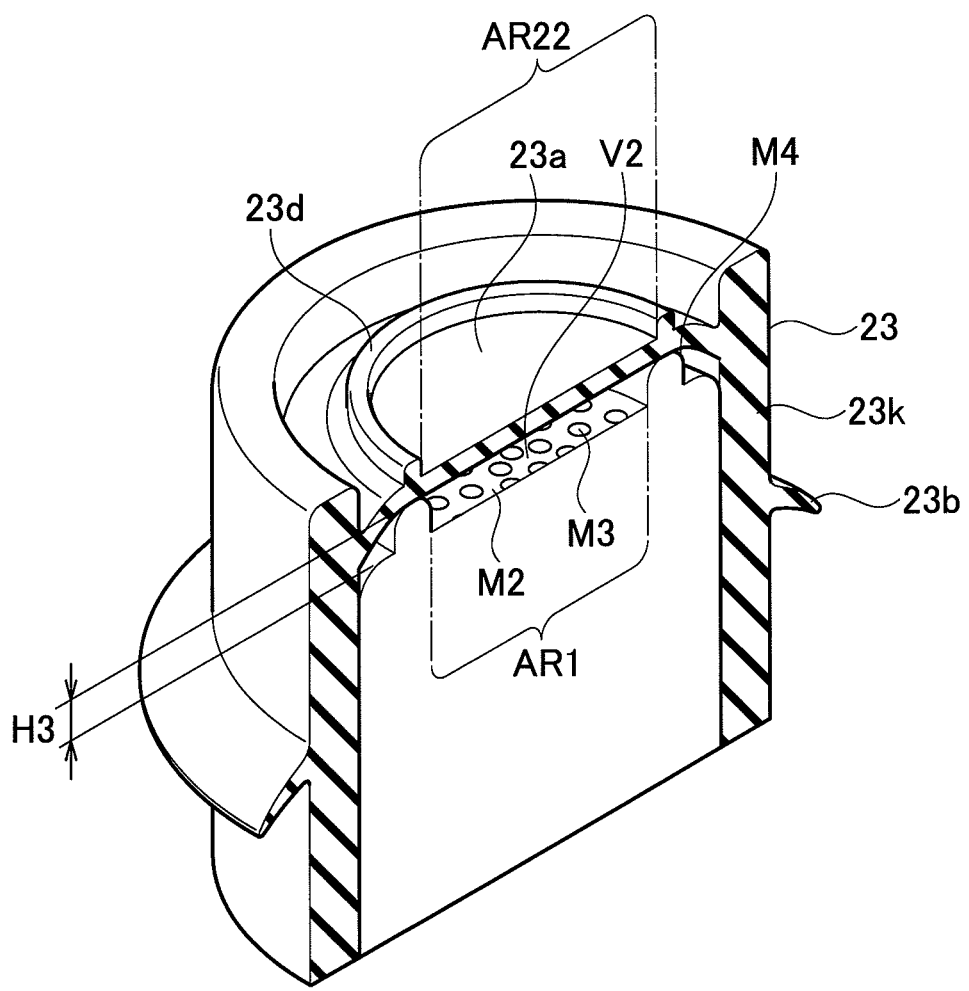
FIG. 8 is a perspective cross-sectional diagram illustrating a second modified example of the waterproof structure according to the first embodiment of the present invention.

FIG. 8 is a diagram corresponding to FIG. 7, illustrating the second modified example that a highly rigid part is formed so as to further surround the area AR22 in addition to the configuration of the first modified example. As illustrated in FIG. 8, a convex rib 23d that protrudes upward in FIG. 8 in the ring-shaped form is formed on a surface on the outer side (on the upper side in FIG. 8) of the thin film part 23a. Since a part where the convex rib 23d is formed is thickened, that part is higher in rigidity than other parts. It is preferable that the convex rib 23d be formed at a position where it is opposed to the convex part M4 because deformation incidental to pushing-up of the thin film part 23a is simplified and the pushed-up shape is stabilized with little fluctuation.

Figure 9A:
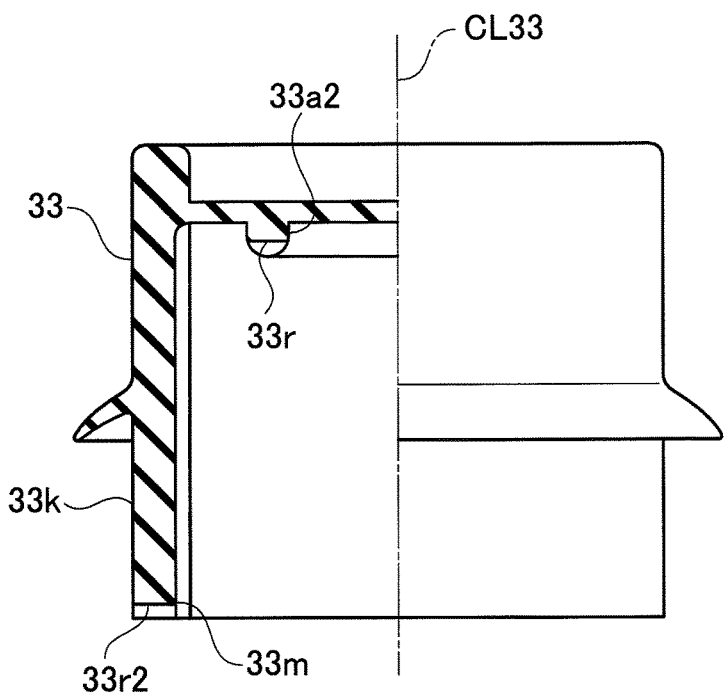
FIG. 9A is a half cross-sectional diagram illustrating a third modified example of the waterproof structure according to the first embodiment of the present invention.
Figure 9B:
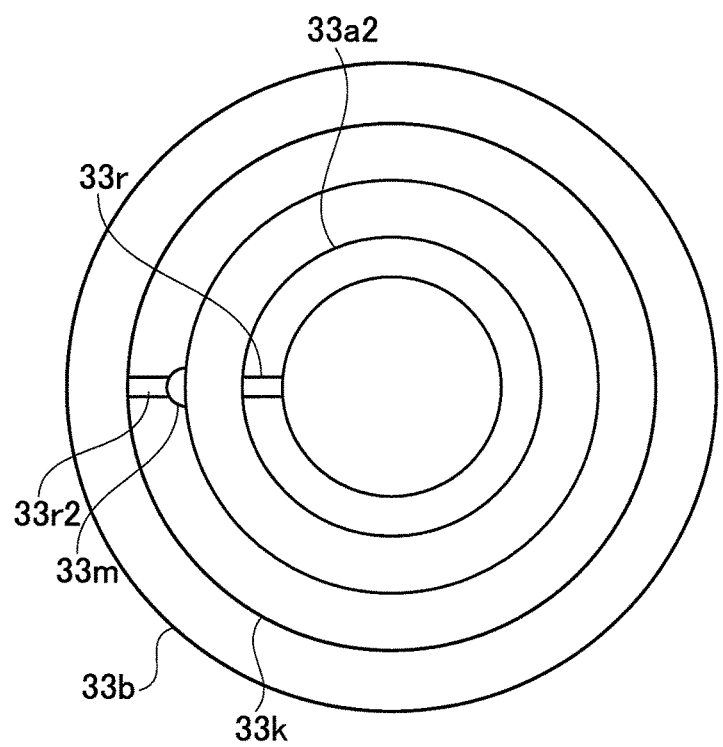
FIG. 9B is a bottom view illustrating the third modified example of the waterproof structure according to the first embodiment of the present invention.

Further, the configurations of the first and second modified examples may be modified as in a third modified example. The third modified example will be described on the basis of the waterproof structure BK according to the first embodiment with reference to FIGS. 9A and 9B and FIG. 10. FIGS. 9A and 9B are a half cross-sectional diagram (FIG. 9A) and a bottom diagram (FIG. 9B) illustrating a packing 33 obtained by applying the third modified example to the packing 3 according to the first embodiment. The packing 33 includes a groove 33m formed by scooping out an inner peripheral surface of a base 33k along a direction of an axis CL33, and a notch 33r formed by notching the leading end side of a convex part 33a2 in a radius direction. In addition, a notch 33r2 that leads from the groove 33m to the outside of the base 33k may be formed on an end face of the base 33k as illustrated in FIG. 9B. The groove 33m is formed to extend such that its end on the lower side in FIG. 9A is open to an end of the base 33k and its end on the upper side in FIG. 9A is situated at a position above the leading end face M2 of the case M1 in a state that the packing 33 is put on the microphone M down to a predetermined position.

A plurality of the grooves 33m may be formed in the base 33k circumferentially. Both ends of the notch 33r are disposed on the inner peripheral surface and the outer peripheral surface of the convex part 33a2. A plurality of the notches 33r may be formed circumferentially. Mismatch in circumferential position between the groove 33m and the notch 33r is allowable.

Figure 10:
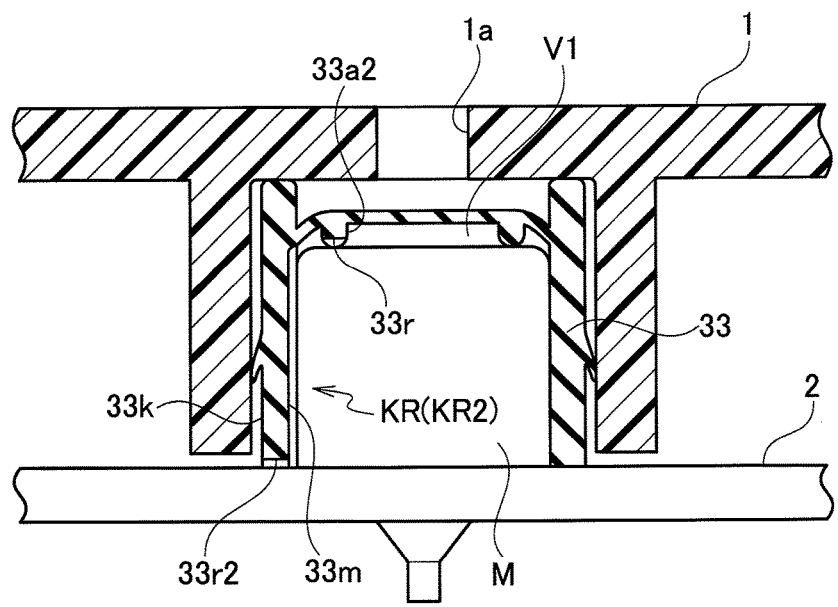
FIG. 10 is a partial cross-sectional diagram illustrating the third modified example of the waterproof structure according to the first embodiment of the present invention.
Figure 11A:
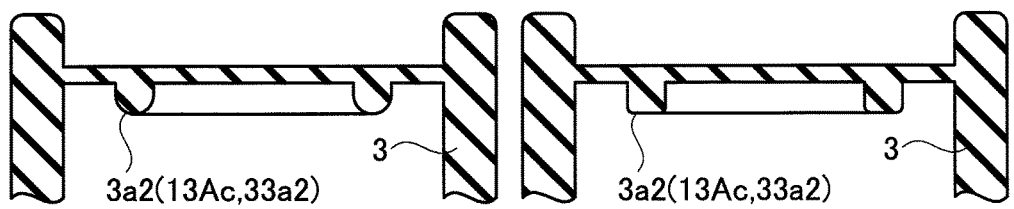
FIG. 11A is a partial cross-sectional diagram illustrating a modified example of the shape of an essential part of the waterproof structure according to the first embodiment of the present invention.
Figure 11B:
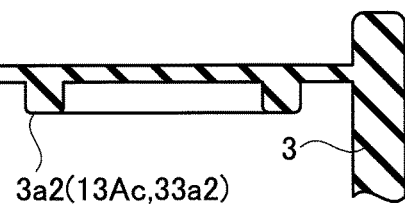
FIG. 11B is a partial cross-sectional diagram illustrating a modified example of the shape of the essential part of the waterproof structure according to the first embodiment of the present invention.
Figure 11C:
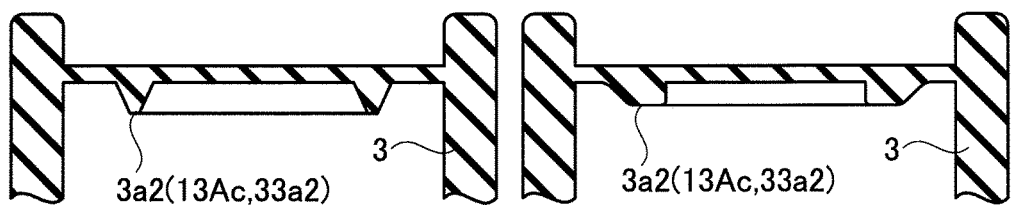
FIG. 11C is a partial cross-sectional diagram illustrating a modified example of the shape of the essential part of the waterproof structure according to the first embodiment of the present invention.
Figure 11D:
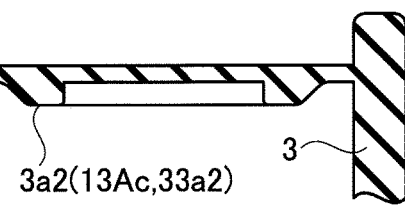
FIG. 11D is a partial cross-sectional diagram illustrating a modified example of the shape of the essential part of the waterproof structure according to the first embodiment of the present invention.

As shown in FIG. 10, since the notch 33r leads to the space V1 and the notch 33r communicates with the groove 33m to allow the space V1 and the groove 33m to communicate with each other when the microphone M is covered with the packing 33 that includes the groove 33m and the notch 33r, an air passage KR for allowing the space V1 and an outer space of the packing 33 to communicate with each other is formed. Thus, air in the space V1 becomes liable to escape to the outside, thereby work of fitting the packing 33 on the microphone M is favorably performed. In addition, when the groove 33r2 is formed, an air route (an air passage KR2) extending from the groove 33m to the outer space of the packing 33 is surely ensured still after assembled. Thus, even if the pressure within the space V1 is changed with temperature change, the pressure so changed will be released into the housing in a waterproof wall and hence a change in tension of the thin film part caused by temperature change will be suppressed. The air passage may have a shape other than the grooved-shape such as the groove 33m, the groove 33r2 and the notch 33r and the air passage may be formed so as to allow the respective spaces to communicate with each other via holes.

It is possible to apply the first to third modified examples to the first and second embodiments by freely combining together the configurations thereof. Moreover, application is also allowed by freely combining together the elements in the first to third modified examples. For example, in the second modified example, the convex part M4 may include a groove or a hole that allows the space V1 and the outer space of the packing 33 to communicate with each other, and the base 23k may include the groove 33m and the groove 33r2 which are the same as those in the third modified example to form the air passages (KR and KR2) as in the third modified example.

The configurations of the first and second embodiments and the first to third modified examples of the present invention are not limited to the above-mentioned ones and may be modified as examples other than the above within a range not departing from the gist of the present invention.

Although the above-mentioned waterproof structures have been described by giving examples that they are applied to the microphone M, the structures may be applied to another audio component that includes a diaphragm, for example, to a speaker. Also in that case, since each of the thin film parts 3a, 13Ab and 23a that will influence the quality of sound emitted from the speaker is not deformed and is stably maintained under constant tension, the output sound is not deteriorated and no fluctuation occurs in the quality of the output sound.

The annular shape of each of the convex parts 3a2, 13Ac, 33a2 and M4 is not limited to a circle and may be set in accordance with the shape of the opening area AR1. The cross-sectional shape of the outline of each of the convex parts 3a2, 13Ac and 33a2 is not limited to an arc and may have various forms, for example, as illustrated in FIGS. 11A to 11D. In addition, the cross-sectional shape of the outline of the convex part M4 may have various forms similarly. The cross-sectional shape of the convex part is a semicircle in FIG. 11A, the cross-sectional shape of the convex part is a rectangle in FIG. 11B, the cross-sectional shape of the convex part is a trapezoid (a triangle) in FIG. 11C, and the cross-sectional shape of the convex part has a slope whose the thickness is gradually reduced as it goes toward an outer periphery in FIG. 11D.

Since the volumes of the spaces V1 and V2 are changed by changing the size in the radial direction or the protruded height H3 of each of the convex parts 3a2, M4, 13Ac and 33a2, it is possible to adjust the frequency characteristics of the gathered sound or the sound to be output to the outside without revising a component body of the microphone M or the speaker. Although it is preferable that each of the convex parts 3a2, 13Ac and 33a2 be continuously formed into a solid ring shape, a nick (a chip) may be partially formed in it. That is, each of the convex parts 3a2, 13Ac and 33a2 may be formed discontinuously.

When the electroacoustic transducer is not the microphone but the speaker, the air hole M3 which is the tone hole functions as a tone hole for transmitting aerial vibration from the diaphragm SD of the speaker to the outside of the case M1, and the sound gathering hole 1a which is the through hole formed in the housing 1 functions as a sound emitting hole for releasing the aerial vibration from each of the thin film parts 3a and 13Ab to the outside of the housing 1. In addition, a signal receiver is disposed on the circuit substrate 2, a sound signal that has arrived from the outside in a wireless or wired manner is received by the signal receiver, and the received signal is processed and output through the speaker as the sound.

What is claimed is:

1. A waterproof structure comprising:
a housing;
an electroacoustic transducer that includes a case having a leading end face formed with tone holes;
a packing that is interposed between the housing and the electroacoustic transducer, and includes a thin film part on a part opposed to the tone holes and a cylindrical base having one end side which is closed by the thin film part; and
an annular member that is interposed between the thin film part and the leading end face of the case without contacting an inner surface of the base of the packing and surrounds the tone holes,
wherein a first space surrounded by the thin film part, the annular member and the case, and a second space surrounded by the thin film part, the annular member, the case and the inner surface of the base are formed by fitting the electroacoustic transducer into the base, and
wherein the case biases the annular member to push up the thin film part of the packing by fitting on the electroacoustic transducer more deeply such that a constant tension is generated on a portion of the thin film part surrounded by the annular member.

2. The waterproof structure according to claim 1, wherein the annular member is a convex part protruding from the thin film part toward the leading end face of the case of the electroacoustic transducer.

3. The waterproof structure according to claim 1, wherein the annular member is a convex part protruding from the leading end face of the case of the electroacoustic transducer toward the thin film part and surrounding the tone holes of the electroacoustic transducer.

4. The waterproof structure according to claim 1, wherein the electroacoustic transducer is a microphone.

5. The waterproof structure according to claim 1, wherein the annular member includes a first air passage allowing a first space which is surrounded by the thin film part, the annular member and the case and a second space which is a space outside the annular member, to communicate with each other.

6. The waterproof structure according to claim 1, wherein the annular member includes a first air passage allowing a first space which is surrounded by the thin film part, the annular member and the case and a second space which is a space outside the annular member, to communicate with each other, and the base includes a second air passage for allowing the second space and a space on the other end side of the base to communicate with each other.

7. Electronic equipment comprising the waterproof structure according to claim 1.

8. The waterproof structure according to claim 1, wherein the first space and the second space are separated from each other by the annular member.

* * * * *